(12) United States Patent
Kim

(10) Patent No.: US 7,422,828 B1
(45) Date of Patent: Sep. 9, 2008

(54) MASK CD MEASUREMENT MONITOR OUTSIDE OF THE PELLICLE AREA

(75) Inventor: Hung-eil Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 618 days.

(21) Appl. No.: 10/774,099

(22) Filed: Feb. 6, 2004

(51) Int. Cl.
*G03F 1/14* (2006.01)
*G06K 9/00* (2006.01)
*G01N 21/956* (2006.01)

(52) U.S. Cl. .................. 430/5; 382/144; 356/237.5
(58) Field of Classification Search ............. 430/5; 382/144
See application file for complete search history.

(56) References Cited

U.S. PATENT DOCUMENTS

| | | | |
|---|---|---|---|
| 6,311,319 B1 * | 10/2001 | Tu et al. ................ | 716/19 |
| 6,557,163 B1 | 4/2003 | Rankin et al. | |
| 6,576,374 B1 | 6/2003 | Kim | |
| 6,812,999 B2 * | 11/2004 | Hickman ............... | 355/52 |
| 2002/0081501 A1 * | 6/2002 | Hasegawa et al. ....... | 430/5 |
| 2002/0102477 A1 * | 8/2002 | Tanaka et al. .......... | 430/5 |

* cited by examiner

*Primary Examiner*—Mark F. Huff
*Assistant Examiner*—John Ruggles
(74) *Attorney, Agent, or Firm*—Renner, Otto, Boiselle & Sklar, LLP

(57) ABSTRACT

A method of fabricating a photomask having a pellicle on a photomask substrate that facilitates accurate measurement of a critical dimension on the photomask, without requiring removal of the pellicle from the photomask substrate. A first pattern is transferred onto the photomask substrate in a first area, and at least one test pattern is transferred onto the photomask substrate outside of the first area. The pellicle is attached to the photomask substrate, wherein the pellicle covers the first area, but does not cover the at least one test pattern.

12 Claims, 4 Drawing Sheets

MASK CD MEASUREMENT MONITOR OUTSIDE OF THE PELLICLE AREA

TECHNICAL FIELD

The present invention relates generally to the field of integrated circuit manufacture and, more particularly, to a method of facilitating the measurement of a mask critical dimension (CD) without removing a pellicle from the mask.

BACKGROUND

In the semi-conductor chip industry it is well known that pattern transfer from a photomask (hereinafter referred to as a mask) to a substrate is accomplished by exposing the mask to a light source. During the pattern transfer process, also called the photolithographic process, patterns on the mask are projected onto the substrate, which has been treated with a photosensitive substance. This results in mask etchings being reproduced onto the substrate. Unfortunately, any foreign substance on the surface of the mask also will be reproduced on the substrate and therefore will interfere with proper pattern transfer to the substrate.

To eliminate contamination of the mask surface, a pellicle is mounted on the mask surface. A pellicle is a thin (~1 μm) polymer film stretched across a frame that is attached to the mask. Particles deposited on the pelliclized mask fall onto the pellicle or glass backside of the mask, and therefore are several millimeters away from the features that are being imaged. With small depths-of-field, these particles will not be in focus and thus will not interfere with pattern transfer.

Referring to FIGS. 1A and 1B, a side and bottom view of a prior art mask and pellicle are illustrated. The mask 10 includes a mask pattern 12 which is formed on a substrate 14 using techniques similar to those used in wafer processing. The mask 10 also includes a pellicle 16, which includes a pellicle frame 18 attached to the substrate 14 and a transparent film 20 stretched across the pellicle frame. The pellicle 16 spans an area over the mask pattern 12 so as to prevent contamination of the mask pattern 12.

As integrated circuit designs become more complicated, it becomes increasingly important that the masks used in photolithography are accurate representations of the original design layout. Unfortunately, it is unrealistic to assume that an electron beam machine and other machines used to manufacture these masks can do so without error. Although mask makers typically repair most defects found at early inspection stages, invariably, defects are found at later inspection stages (such as after pelliclization of the mask has occurred).

Despite the many precautions which are taken to prevent damage to the mask, it still is necessary to periodically check the mask in order to assure that the pattern projected through the mask is the same as the desired pattern. Inspection is necessary to ensure the fidelity of the masks. Patterns on the masks must meet stringent criteria for size, shape, spacing, orientation, overlap, and placement of features. Defects must be repaired to prevent replication of errors across the wafers.

Generally, the later inspection stages include measuring the mask CD using an electron beam CD measurement tool. Since the pattern on the mask to be measured is behind the pellicle, the pellicle is removed before the measurement is made to increase the accuracy of the measurement.

A drawback of the present method for inspecting pelliclized masks is that before the inspection can be performed the pellicle must be removed. Pellicle removal can lead to several problems. For example, the mask can be damaged during the removal and/or reinstallation of the pellicle. Additionally, the removal and installation of the pellicle requires a certain amount of time, thereby adding to the cost of ownership of the mask. Furthermore, material costs associated with a new pellicle also are a factor in the cost of ownership of the mask.

As a result, there exists a need in the art for a method of inspecting a pelliclized mask that reduces the inspection time and material costs associated with mask inspection, thereby reducing cost of ownership of the mask.

SUMMARY OF THE INVENTION

According to one aspect of the invention, the invention is directed to a method of fabricating a photomask that facilitates accurate measurement of the photomask critical dimension. The method includes the steps of transferring a first pattern on a substrate in a first area; transferring at least one test pattern on the substrate outside of the first area; and attaching a pellicle to the substrate, wherein the pellicle covers the first area, but does not cover the at least one test pattern.

Another aspect of the invention relates a photomask that facilitates accurate measurement of the photomask critical dimension. The photomask includes: a substrate; a first pattern formed on the substrate; at least one test pattern formed on the substrate; and a pellicle attached to the substrate, wherein the pellicle is not attached over the at least one test pattern.

Yet another aspect of the invention relates to a method of monitoring a critical dimension of a photomask including a substrate having a first pattern in a first area, a test pattern in a second area outside of the first area, and a pellicle attached to the substrate which covers the first area but does not cover the second area, wherein a critical dimension of the test pattern is similar in magnitude to a critical dimension of the first pattern (e.g., since the first pattern and the test pattern are formed at substantially the same time under substantially the same conditions, their respective critical dimensions are substantially the same). The method includes the steps of measuring the critical dimension of the test pattern at a time when the pellicle is attached to the substrate; and estimating the critical dimension of the first pattern based on the measuring step.

Other aspects, features, and advantages of the invention will become apparent from the following detailed description. It should be understood, however, that the detailed description and specific examples, while indicating several embodiments of the present invention, are given by way of illustration only and various modifications may naturally be performed without deviating from the present invention.

DISCLOSURE OF INVENTION

Figure 1A:
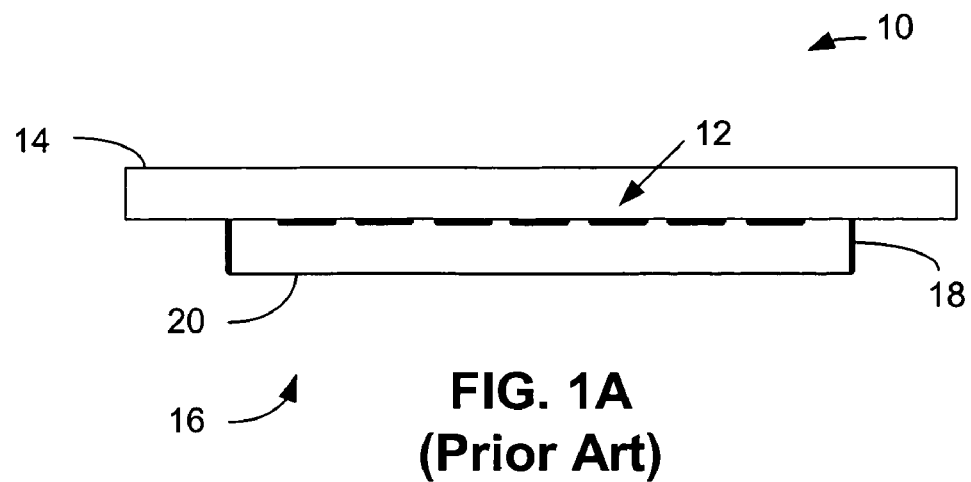
FIG. 1A is a schematic side view of a prior art mask and pellicle formed on a substrate.
Figure 1B:
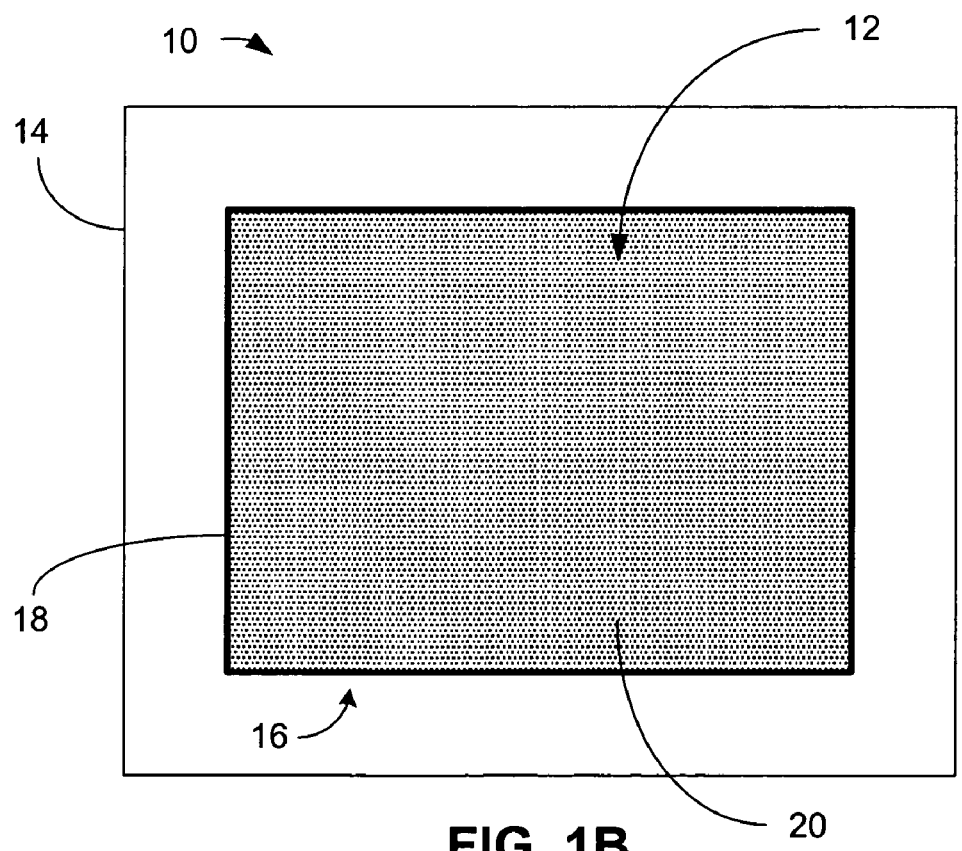
FIG. 1B is a bottom view of the mask illustrated in FIG. 1A.

In the detailed description that follows, corresponding components have been given the same reference numerals, regardless of whether they are shown in different embodiments of the present invention or at different times during a processing method. To illustrate the present invention in a clear and concise manner, the drawings may not necessarily be to scale.

The present invention will be described with respect to a conventional binary chrome-on-glass mask. It is noted, however, that the invention can be applied to other types of masks. For example, the invention can be applied to phase-shifting masks, such as alternating, rim shift, attenuated, phase-edge and outrigger type masks.

Figure 2A:
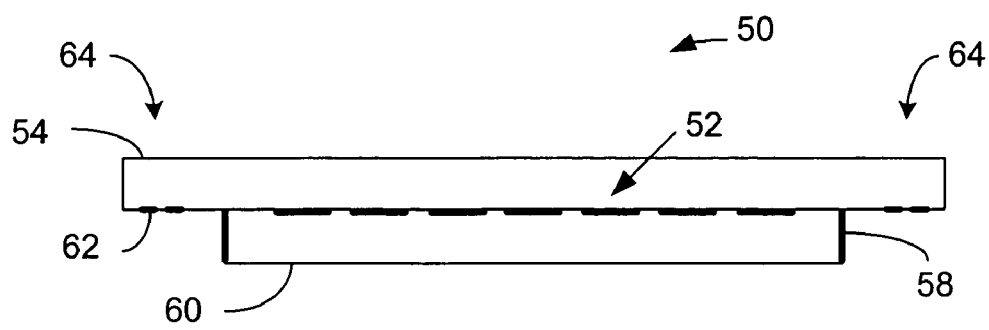
FIG. 2A is a schematic side view of a mask and pellicle in accordance with an embodiment of the present invention.
Figure 2B:
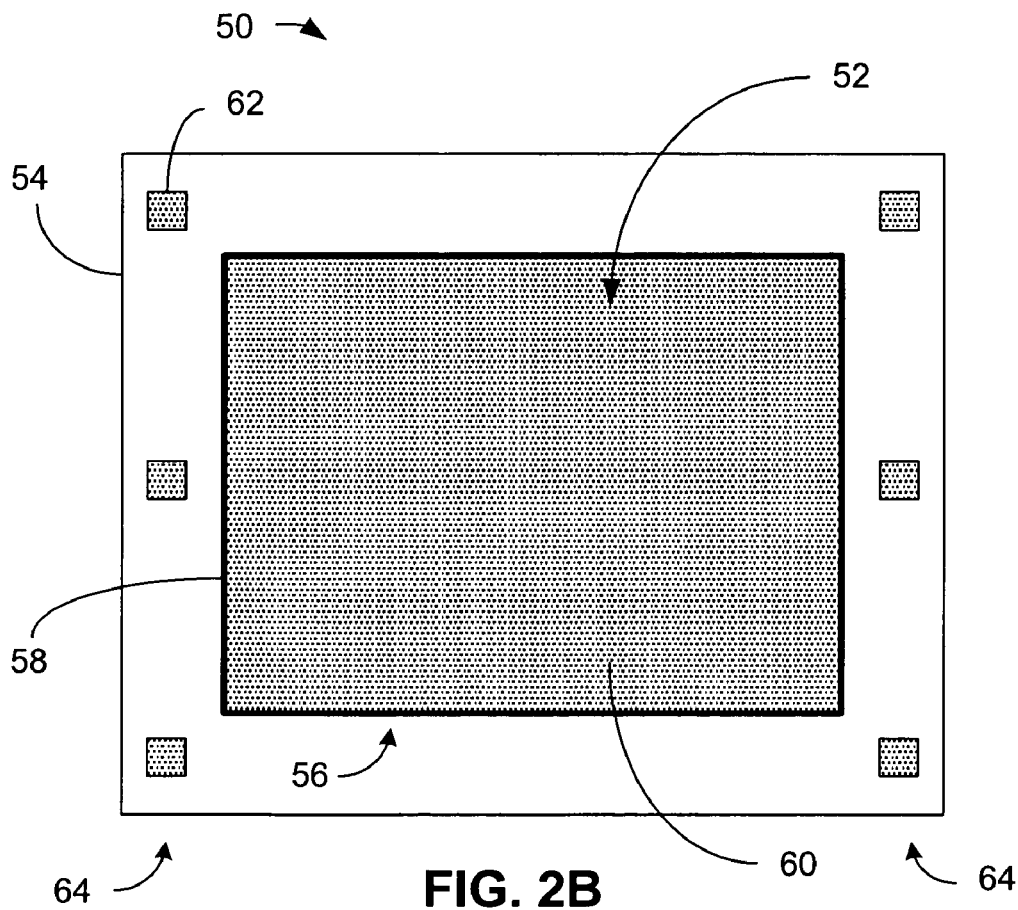
FIG. 2B is a bottom view of the mask illustrated in FIG. 2A.

Referring to FIGS. 2A and 2B a mask 50 in accordance with the present invention is illustrated. The mask 50 includes a mask pattern 52 formed on a substrate 54. A pellicle 56 spans over the mask pattern 52 and includes a pellicle frame 58 attached to the substrate, and a transparent film 60 stretched across the pellicle frame. Additionally, one or more test patterns 62 are formed on the substrate 54 in an area 64 outside of the pellicle 56. The test patterns 62 outside of the pellicle (as defined by the pellicle frame 58) are not covered by the pellicle 56 and easily can be measured to determine the mask CD.

The test patterns 62 preferably are created during the formation of the mask pattern 52 and thus are formed at substantially the same time and under the same or similar conditions as the mask pattern, e.g., the same environment, dose, mask writer, etc. Additionally, the test patterns 62 preferably include patterns typical of the mask pattern 52. For example, mask patterns often require optical proximity correction due to proximity effects, i.e., image shape distortion where features with the same nominal CD print differently due to environmental variations. As is known in the art, proximity correction is an adjustment of the features of the mask pattern to correct for proximity effects. These adjustments include adjusting line size and/or adding small geometries, such as serifs, hammerheads and scattering bars, for example. Any adjustments made in the mask pattern 52 also can be included in the test patterns 62. Alternatively, a portion of the mask pattern 52 can be duplicated as the test pattern 62.

Accordingly, the test patterns 62 provide an accurate representation of the mask pattern 52 for purposes of determining mask CD, e.g., the test pattern CD is similar in magnitude to the mask pattern CD. Moreover, since the pellicle 58 does not cover the test patterns 62, accurate measurements of the test pattern CD can be made using an electron beam CD measurement tool or the like without removing the pellicle 58. Thus, the mask CD can be estimated accurately from the test pattern CD measurement. Additionally, the mask CD can be obtained in less time as compared to prior art methods of obtaining mask CD. Furthermore, the likelihood of damaging a mask due to pellicle removal/installation and the associated costs are effectively eliminated, since the mask CD can be measured without removing the pellicle.

Figure 3:
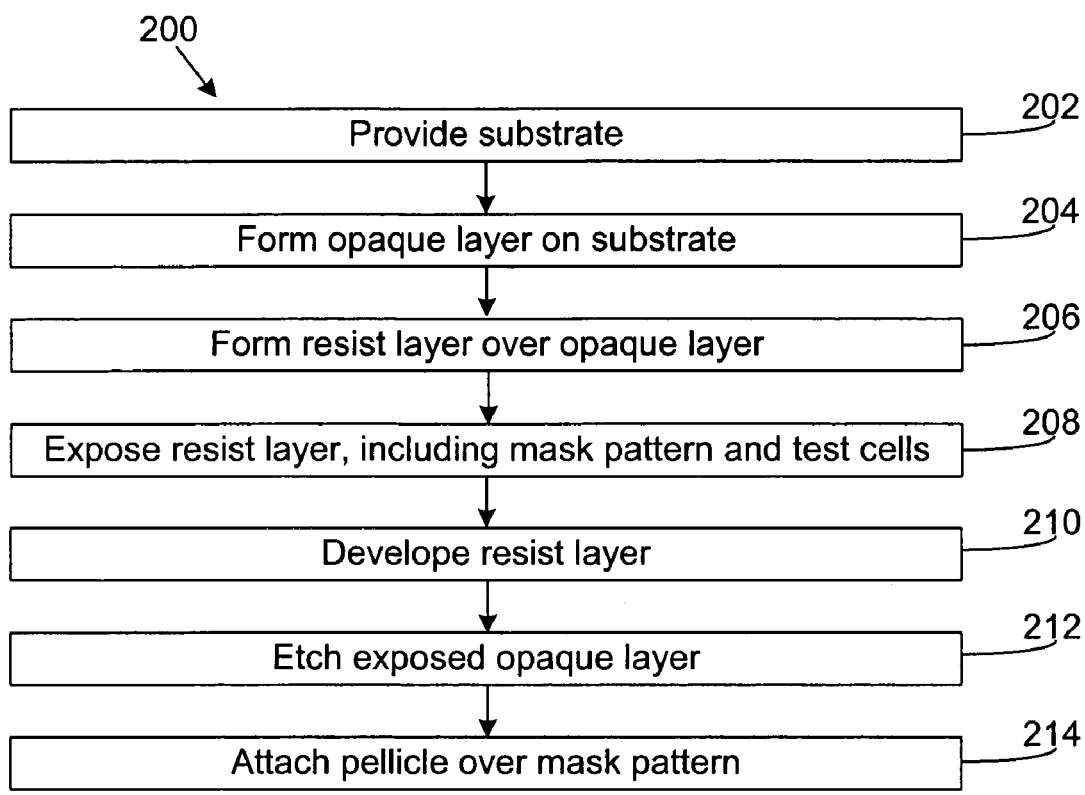
FIG. 3 is a flow diagram illustrating an exemplary embodiment of a method of processing a mask in accordance with the present invention.
Figure 4A:
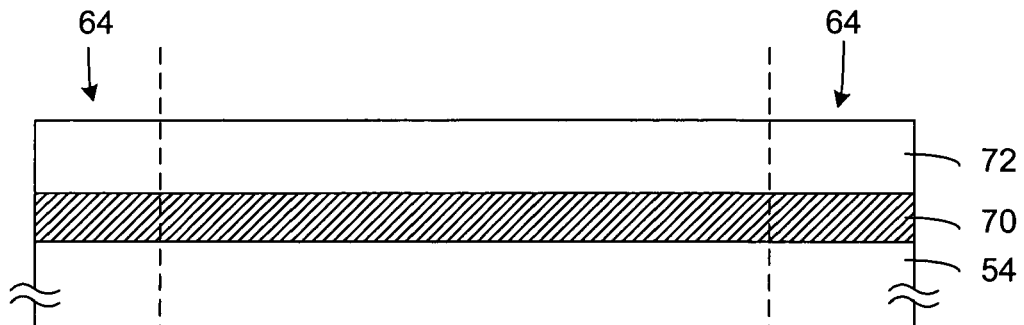
FIG. 4A is a sectional view of a mask at a certain point during processing of the mask using a method in accordance with the present invention.
Figure 4B:
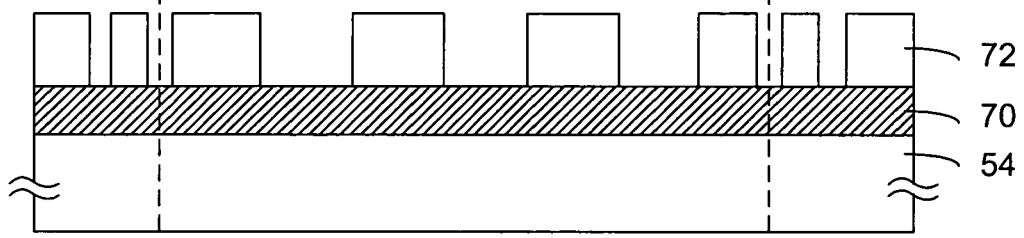
FIG. 4B is a sectional view of the mask during another point of the mask processing.
Figure 4C:
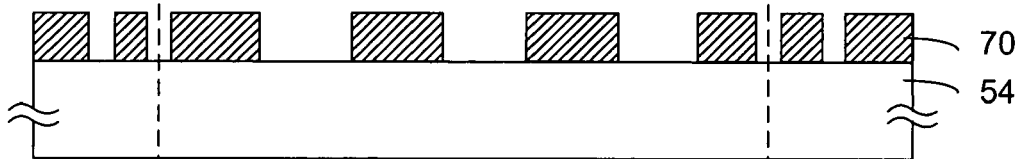
FIG. 4C is a sectional view of the mask during yet another point of the mask processing.
Figure 4D:
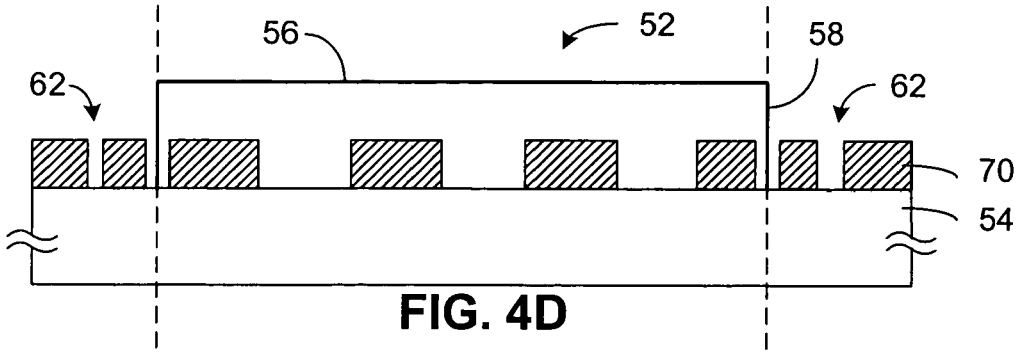
FIG. 4D is a sectional view of the mask during yet another point of the mask processing.

Referring to the flowchart 200 of FIG. 3 in conjunction with the diagrams of FIG. 4A-FIG. 4D, exemplary processing steps for fabricating the mask 50 on a substrate are shown.

The process begins at step 202 with a substrate 54, which generally is a glass type substrate, such as fused silica, for example. At step 204, an opaque layer 70 is formed over the substrate 54. Chromium is the most common opaque material used for masks and typically is sputtered onto the substrate to a thickness of about 500 Angstroms to 1100 Angstroms. At step 206, a resist layer 72 is formed over the opaque layer 70. As is conventional, the type of resist used is dependent on the beam writer's exposure wavelength. For example, electron-beam generation usually requires e-beam sensitive resists, e.g., polybutene-1-sulfone (PBS), while resists for optical beam writers include ARCH 895i and TOK iP3500.

Moving to step 208, the resist layer 72 is exposed according to a desired circuit pattern. Mask patterning is accomplished primarily by means of beam writers, such as the aforementioned electron beam writers and optical beam writers, for example. Exposure of the resist layer includes exposing a portion of the resist layer 72 that will form the mask pattern 52, and exposing a portion of the resist layer 72 that will form one or more test patterns 62. In forming the test patterns 62, the resist layer 72 is exposed in an area 64 that will not be covered by the pellicle 56. After exposure, the resist layer 72 is developed at step 210, which exposes portions of the opaque layer 70.

Following development, the exposed opaque layer 70 at step 212 is etched to produce the mask pattern 52 and the test patterns 62. Etching of the opaque layer may be either by a wet etchant or by a dry etchant as is conventional. At step 214, a pellicle 56 is attached to the substrate 54 on the chrome side of the substrate. As noted previously, the pellicle 56 is attached to the substrate 54 over the mask pattern 52. The pellicle is not attached over the portion 64 where the test patterns 62 are formed. The pellicle 56 includes the pellicle frame 58, which is attached to the substrate, and a transparent film 60 stretched across the pellicle frame. The pellicle film 60 usually is a polymer, with nitrocellulose and forms of Teflon also being acceptable.

The resultant mask 50 facilitates accurate measurement of the mask CD without removing the pellicle 56. Additionally, the time required to check the mask CD is reduced, since pellicle removal and installation is eliminated. Furthermore, the costs associated with pellicle removal and installation, e.g., labor costs, material costs, etc., also are eliminated, thus reducing the cost of ownership of the mask.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating a photomask that facilitates accurate measurement of a critical dimension on the photomask, comprising:

forming a first pattern on a substrate in a first area;

forming at least one test pattern on the substrate outside of the first area, wherein said at least one test pattern is formed by duplicating a portion of the first pattern, said at least one test pattern representative of the critical dimension on the photomask; and attaching a pellicle to the substrate, wherein the pellicle covers the first area, but does not cover the at least one test pattern.

2. The method of claim 1, wherein forming the first pattern and forming the at least one test pattern include forming the first pattern and the at least one test pattern on the substrate at the same time.

3. The method of claim 1, wherein forming the first pattern and forming the at least one test pattern occur under the same or similar conditions.

4. The method of claim 1, wherein the at least one test pattern includes patterns typical of the first pattern.

5. The method of claim 1, wherein duplicating a portion of the first pattern as the at least one test pattern includes using optical proximity correction in the at least one test pattern.

6. The method of claim 5, wherein using optical proximity correction includes using shapes selected from the group consisting of serifs, hammerheads and scattering bars.

7. A photomask that facilitates accurate measurement of a critical dimension on the photomask, comprising:
   a substrate;
   a first pattern formed on the substrate;
   at least one test pattern formed on the substrate, wherein said at least one test pattern is derived from a portion of the first pattern, said at least one test pattern representative of the critical dimension on the photomask; and
   a pellicle attached to the substrate, wherein the pellicle is not attached over the at least one test pattern.

8. The photomask of claim 7, wherein the photomask is a binary chrome-on-glass mask.

9. The photomask of claim 7, wherein the photomask is a phase shifting mask.

10. The photomask of claim 7, wherein the at least one test pattern includes patterns typical of the first pattern.

11. The photomask of claim 7, wherein the at least one test pattern includes optical proximity correction.

12. The photomask of claim 11, wherein the optical proximity correction includes shapes selected from the group consisting of serifs, hammerheads and scattering bars.

\* \* \* \* \*